(12) United States Patent
Kim

(10) Patent No.: US 6,504,881 B1
(45) Date of Patent: Jan. 7, 2003

(54) VITERBI DECODER WITH ENHANCED TEST FUNCTION

(75) Inventor: Yong-Chan Kim, Yongin-shi (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/260,381

(22) Filed: Mar. 2, 1999

(30) Foreign Application Priority Data

Mar. 2, 1998 (KR) .............................................. 98-6839

(51) Int. Cl.[7] .............................................. H03M 13/41
(52) U.S. Cl. ........................ 375/341; 375/224; 375/262
(58) Field of Search ................................. 375/224, 262, 375/263, 265, 340, 341, 377; 714/786, 792, 794, 795, 796

(56) References Cited

U.S. PATENT DOCUMENTS 4,614,933 A * 9/1986 Yamashita et al. ............. 341/51
5,710,784 A * 1/1998 Kindred et al. ............. 375/262
5,737,342 A * 4/1998 Ziperovich .................. 714/736

\* cited by examiner

Primary Examiner—Stephen Chin
Assistant Examiner—Chieh M. Fan
(74) Attorney, Agent, or Firm—F. Chau & Associates, LLP

(57) ABSTRACT

The present invention relates to an integrated viterbi decoder with improved test function. The viterbi decoder recovers original symbol and data bits from convolutional binary symbol stream, reducing a noise and data loss originated from a channel fading. For enhancing the test function of the viterbi decoder, the viterbi decoder of the present invention stores predetermined test control signals in a test register. During a test, the test control signals are synchronized with a test clock apart from a frame synchronous signal of the viterbi decoder. The test time of the viterbi decoder, thus, is not restricted by the frame synchronous signal. As a result, the test time of the viterbi decoder can be reduced without addition of an external pin.

13 Claims, 3 Drawing Sheets

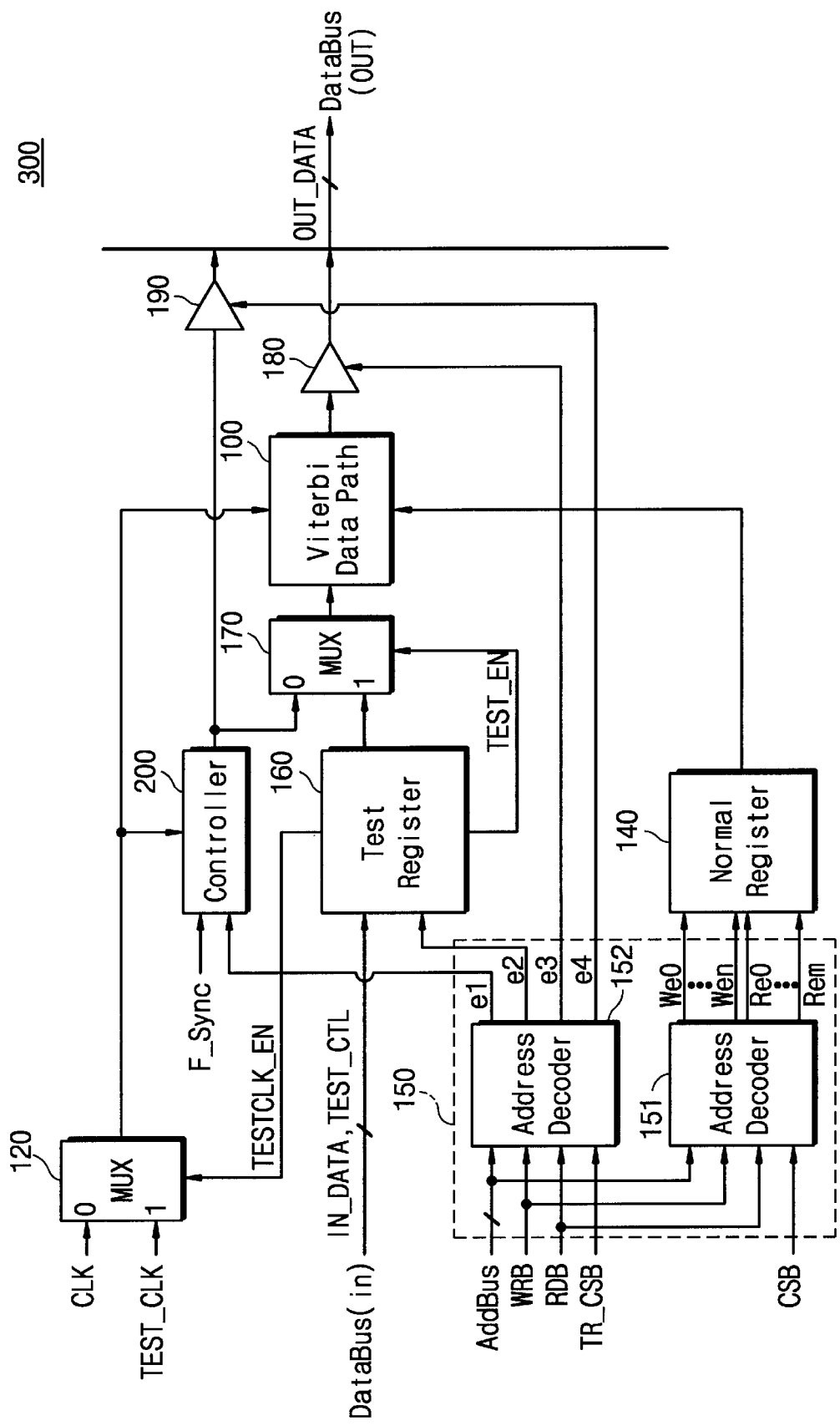

VITERBI DECODER WITH ENHANCED TEST FUNCTION

FIELD OF THE INVENTION

The present invention relates to an integrated viterbi decoder circuit and, more particularly to a viterbi decoder having enhanced test function.

BACKGROUND OF THE INVENTION

A viterbi decoder is used to decode encoded convolutional codes using a maximum likelihood method. The decoder selects a path of a code sequence, which is most likely to be the received code sequence, from among a plurality of known code sequences. The decoder therefore obtains the decoded data which corresponds to the selected path. Viterbi decoders are used, for example, for error correction in satellite communication systems.

The principles of viterbi decoding are described, for example, in "CDMA Principles of Spread Spectrum Communication" by A. J. VITERBI, ADDISON-WESLEY PUBLISHING COMPANY, pp. 132–138, April, 1995. A viterbi decoder is discussed in U.S. Pat. No. 4,614,933.

FIG. 1 shows a block diagram of a conventional viterbi decoder. The viterbi decoder 30 comprises a viterbi data path 10 and a controller 20. The data path 10 has an input buffer 12, a symbol metric table (SMT) unit 13, a branch metric unit 14, an add compare select (ACS) unit 15, a trace back unit 16, and an output buffer 17.

The controller 20 generates a variety of control signals CTL which are synchronized with a frame sync signal F_Sync. The viterbi data path 10 decodes a code sequence IN_DATA and outputs a decoded data OUT_DATA under the control of the control signals CTL from the controller 20.

The control signals CTL synchronized with the frame synchronous signal F_Sync are also used for testing the viterbi decoder 30, and thus the test time of the viterbi decoder 30 is determined and restricted by the frame synchronous signal F_Sync. In general, it takes about 12 ms (120,000 clock cycles with respect to 10 MHz clock) to test one frame with the control signals CTL synchronized with the frame sync signal F_Sync. Since several kinds of tests are normally needed to increase the test reliability of a viterbi decoder, a test time for one product increases in proportion to the numbers of the tests. Such features of a conventional viterbi decoder results in an increase in production cost.

In particular, for the scan-in/scan-out testing which is well known to those skilled in the art, many flip-flop circuits are needed to be constructed on the same chip on which a viterbi decoder is mounted. Hence, the viterbi decoder circuitry is complicated and requires a large amount of area, as a result, yielding an increase in production cost.

SUMMARY OF THE INVENTION

It is an object of the present invention to provide a viterbi decoder which performs enhanced test operations as well as normal operations, so that test time of the viterbi decoder may be shortened.

To attain the above object, a viterbi decoder according to the present invention comprises a plurality of buses for test control signals externally applied from a test system, a controller, a viterbi data path, and a test circuit. The controller generates a plurality of decoding control signals synchronized with a normal clock signal during a normal operation. The viterbi data path includes an input buffer, a symbol metric table unit, a branch metric unit, an add compare select unit, a trace back unit and an output buffer. The viterbi data path decodes code sequences provided from the test system. The viterbi data path is controlled by the decoding control signals from the controller, synchronizing with the normal clock signal during the normal operation.

The test circuit tests the controller and the viterbi data path with a plurality of test control signals and a test clock from the test system during a test operation. The test circuit comprises an address decoder which generates control signals for enabling other components of the viterbi decoder to perform the test. The test circuit receives from the test system address signals, a register write strobe signal, a register read strobe signal, a test mode selecting signal, and a normal mode selecting signal. The test circuit includes a test register for storing the test control signals and the code sequences in response to an enable signal from the address decoder and the test control signals, a first multiplexer which selects one of the normal clock and the test clock in response to a test clock enable signal from the test register, and a second multiplexer which selectively outputs either the decoding control signals from the controller or the test control signals from the test register in response to a test enable signal from the test register. The selected output signals of the second multiplexer are provided to the viterbi data path. The test circuit further includes a first buffer which outputs the output of the viterbi data path to the test system via the data bus in response to an enable signal from the address decoder, and a second buffer which outputs the output of the controller to the test system via the data bus in response to an enable signal from the address decoder.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein:

FIG. 3 is a schematic block diagram of a preferred embodiment of a viterbi decoder according to the present invention.

DESCRIPTION OF PREFERRED EMBODIMENTS

Figure 1:
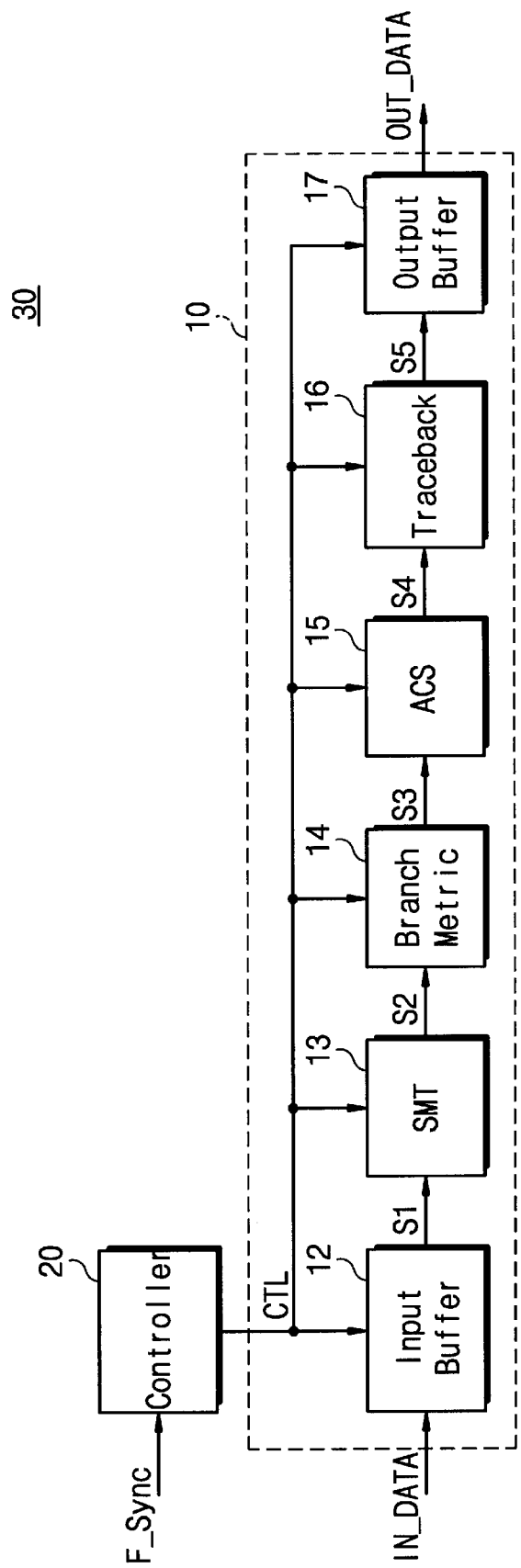
FIG. 1 is a block diagram illustrating a conventional viterbi decoder.
Figure 2:
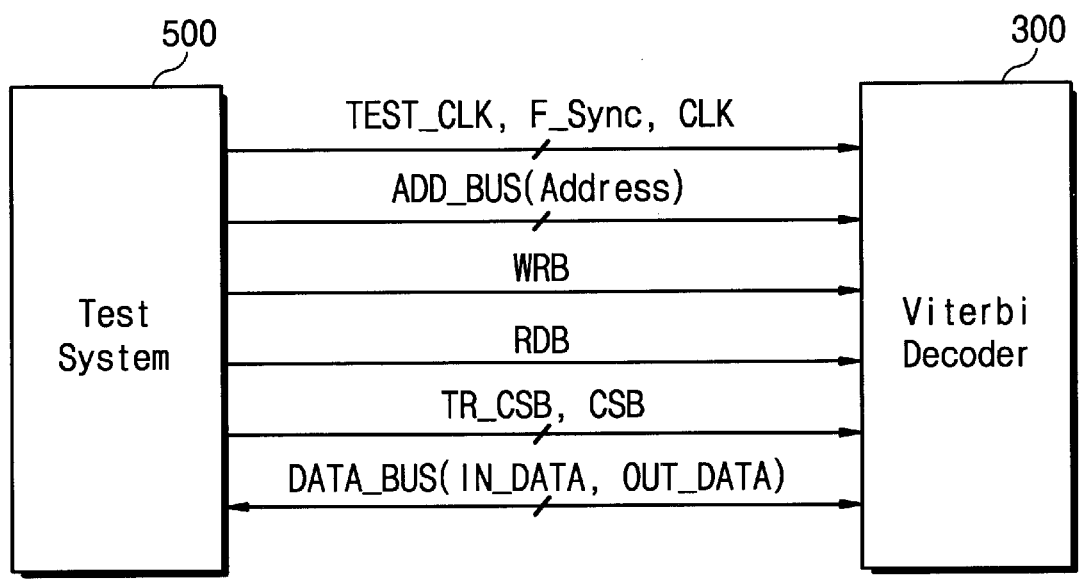
FIG. 2 is a schematic view illustrating a connection between a viterbi decoder and its test system in accordance with the present invention.

FIG. 2 is a schematic view illustrating a connection between a viterbi decoder and a test system in accordance with the present invention.

Referring to FIGS. 2 and 3, the test system 500 connects with the viterbi decoder 300 through an address bus ADD_BUS and a data bus DATA_BUS. The data bus DATA_BUS is a bidirectional data bus. That is, the test system provides a code sequence IN_DATA to the viterbi decoder through the data bus DATA_BUS, and decoded data OUT_DATA from the viterbi decoder is provided to the test system through the data bus DATA_BUS during tests of the viterbi decoder 300. For a fast test, predetermined test control signals are provided from the test system 500 to the viterbi decoder 300 through the data bus DATA_BUS. The code sequence IN_DATA and the test control signals TEST_CTL are stored in a test register (FIG. 3) of the viterbi decoder 300. For controlling the test register, address signals from the test system are supplied to the viterbi decoder 300 through the address bus ADD_BUS. Further, several control signals from the test system, for example, a register write strobe signal WRB, a register read strobe signal RDB, a test mode selecting signal TR_CSB and a normal mode selecting signal CSB are supplied to the viterbi decoder 300. Further, the test system 500 provides a frame synchronous signal F_Sync, a test clock TEST_CLK and a normal clock CLK to the viterbi decoder 300. When the test mode selecting signal TR_CSB becomes active, for instance, a logic low level ("0"), the viterbi decoder 300 is converted into the test mode using the test clock TEST_CLK instead of the normal clock CLK.

FIG. 3 is a schematic block diagram of a preferred embodiment of a viterbi decoder according to the present invention.

The viterbi decoder 300 comprises a controller 200 for generating a plurality of decoding control signals CTL synchronized with the normal clock signal CLK, and a viterbi data path 100 including an input buffer, a symbol metric table unit, a branch metric unit, an add compare select unit, a trace back unit and an output buffer, for decoding the code sequence IN_DATA. The viterbi data path 100 is controlled by the decoding control signals CTL received through a multiplexer 170 from the controller 200 during a normal operation of the viterbi decoder, wherein the decoding control signals CTL are synchronized with the normal clock signal CLK. On the other hand, during a test operation of the viterbi decoder, the viterbi data path 100 is controlled by the test control signals TEST_CTL received through the multiplexer 170 from the test register 160, wherein the test control signals TEST_CTL are synchronized with the test clock TEST_CLK.

For the normal operation, the viterbi decoder 300 further comprises a normal register 140 for storing data to be decoded and a first address decoder 151 for providing control signals to the normal register 140. The control signals from the first address decoder 151 includes normal register writing enable signals We0–Wen and normal register reading enable signals Re0–Rem for the normal operation, where 'n' and 'm' are integers. For generating these enable signals We0–Wen and Re0–Rem, the first address decoder 151 receives from the test system the address signals Addbus, the register write strobe signal WRB, the register read strobe signal RDB and a normal mode selecting strobe signal CSB. When the normal mode selecting strobe signal CSB becomes active (for example, logic low level), the first address decoder 151 generates enable signals We0–Wen and Re0–Rem for the normal operation. The enable signals We0–Wen are used for writing data into the normal register 140, and other enable signals Re0–Rem are used for reading data from the normal register 140. During the normal operation, the viterbi data path 100 decodes the code sequence IN_DATA accessed from a pre-assigned location(s) of the normal register 140 and outputs the decoded data OUT_DATA in response to decoding control signals CTL from the controller 200.

For the test operation, the viterbi decoder 300 further includes test circuits comprising a first multiplexer 120, a second address decoder 152, the test register 160, a second multiplexer 170, a first buffer 180, and a second buffer 190. The first multiplexer 120 selects either the normal clock CLK or the test clock TEST_CLK in response to a test clock enable signal TESTCLK_EN from the test register 160. When the test clock enable signal TESTCLK_EN is active (for example, a logic high level), the test of the viterbi decoder 300 is controlled by control signals synchronized with the test clock TEST_CLK (the control signals will be described in detail below). On the other hand, when the test clock enable signal TESTCLK_EN is inactive (for example, a logic low level), the viterbi decoder 300 operates normally under the decoding control signals CTL synchronized with the normal clock CLK.

The test register 160 stores the code sequence IN_DATA and the test control signals TEST_CTL from the test system 500(referring FIG. 2). The test control signals TEST_CTL can be predetermined in reference to the decoding control signals CTL, since the decoding control signals CTL are known signals for the test of the viterbi decoder. As a preferred embodiment of a viterbi decoder according to the present invention, the test register 160 comprises three 8-bit registers, or a 24-bit register, of which 20 bits are used for storing the test control signals TEST_CTL and the rest are used for storing control signals such as the test clock enable signal TESTCLK_EN and a test enable signal TEST_EN.

The second address decoder 152, as a preferred embodiment according to the present invention, generates four enable signals e1–e4. For generating these enable signals e1–e4, the address decoder 152 receives the address signals Add bus, the register write strobe signal WRB, the register read strobe signal RDB and the test mode selecting strobe signal TR_CSB. When the test mode selecting strobe signal TR_CSB is active (for example, a logic low level), the address decoder 152 generates enable signals e1–e4 for the test operation.

The second multiplexer 170 selects either the decoding control signals CTL from the controller 200 or the test control signals TEST_CTL from the test register 160 in response to the test enable signal TEST_EN read from the test register 160. When the test enable signal TEST_EN is active (for example, a logic high level), the test of the viterbi decoder 300 is controlled by the test control signals TEST_CTL from the test register 160. On the other hand, when the test enable signal TEST_EN is inactive (for example, a logic low level), the viterbi decoder 300 executes normal operation controlled by the decoding control signals CTL from the controller 200, outputs through buffer 190. As a result of the test operation, the decoded data processed in the viterbi data path 100 are outputted through a first buffer 180.

Therefore, the operations of the viterbi decoder 300 may be classified into the normal operation and the test operation. In the normal operation, the normal mode selecting strobe signal CSB is active, for example, a logic low level. At this time, the test clock enable signal TESTCLK_EN and the test enable signal TEST_EN are logic low levels. Thereby, the normal clock CLK and the decoding control signals CTL are selected in the first and the second multiplexers 120 and 170, respectively. For the normal operation of the viterbi decoder 300, the first address decoder 151 generates enable signals We0–Wen for writing data into the normal register 140 and Re0–Rem for reading data from the normal register 140. In the normal operation, the code sequence IN_DATA is stored at a prescribed address(for example, 18$h$) in the normal register 140. The viterbi data path 100, then, decodes the code sequence IN_DATA from the normal register 140 in response to the decoding control signals CTL and outputs the decoded data OUT_DATA as a result.

In the test operation, the test mode selecting strobe signal TR_CSB is active, for example a logic low level. At this time, the test clock enable signal TESTCLK_EN and the test enable signal TEST_EN are logic high levels. Thereby, the test clock TEST_CLK and the test control signal TEST_CTL are selected in the first and the second multiplexers 120 and 170, respectively. For the test operation of the viterbi decoder 300, the second address decoder 152 generates four enable signals e1 through e4. When the first enable signal e1 is active (for example, logic high) and provided to the controller 200, operation of the controller 200 is monitored by the test system 500. When the fourth enable signal e4 is active (for example, logic high) and provided to the second buffer 190, the output of the controller 200 is delivered to the test system 500 through the second buffer 190 via the data bus DATA_BUS. When the second enable signal e2 is active (for example, logic high) and provided to the test register 160, the code sequence IN_DATA and the test control signals TEST_CTL are stored in the test register 160. For the test operation, then, the code sequence IN_DATA and the test control signal TEST_CTL are provided to the viterbi data path 100 through the second multiplexer 170. In the viterbi data path 100, the code sequence IN_DATA is decoded by the test control data TEST_CTL and outputted to the test system 500 through the first buffer 180 in response to the logic high third enable signal e3. That is, when the third enable signal e3 is active (for example, logic high), the first buffer 180 is enabled to output the decoded data $OUT_{\_DATA}$.

The following table illustrates the test time of the viterbi decoder according to an illustrative embodiment of the present invention.

TABLE 1

| BLOCK | TEST VECTOR TIME |
|---|---|
| Input buffer | — |
| SMT | 0.5343 ms |
| Branch Metric | 0.4173 ms |
| ACS | 1.0432 ms |
| Trace Back | 2.7447 ms |
| Output Buffer | 0.7495 ms |
| TOTAL | 5.4890 ms |

In Table 1, total test time is 5.4890 ms. The test time of the conventional viterbi decoder is about 12 ms (120,000 clock cycles with respect to 10 MHz clock). Compared with the test time of the conventional viterbi decoder, that of the illustrative viterbi decoder according to the present invention is shortened. As shown in Table 1, the test time of the viterbi decoder of the present invention is less than half of that of the conventional viterbi decoder. Furthermore, the illustrative viterbi decoder of the present invention uses test registers for storing the test control signal TEST_CRL, so that an external pin used in the conventional viterbi decoder is not required in the viterbi decoder of the present invention.

As described above, the viterbi decoder according to the present invention can reduce the test time and the production cost by performing the test operations with the test circuit controlled by the test control signals TEST_CRL stored in the test register 160, without having the additional pin required in the conventional viterbi decoder.

Although the viterbi decoder of the present invention has been described and illustrated in the above description and drawings, it is understood that this description is by example only. Numerous changes and modifications can be made by those skilled in the art without departing from the true spirit and scope of the invention.

What is claimed is:

1. A viterbi decoder for performing viterbi decoding operations with a test system, the viterbi decoder comprising:

a clock for synchronizing the viterbi decoding operations;

a controller for generating decoding control signals synchronized to the clock;

a viterbi decoding circuit for performing the viterbi decoding operations in response to the decoding control signals, the viterbi decoding circuit including a symbol metric table unit, a branch metric unit, an add compare select unit, and a trace back unit; and test means for testing the controller and the viterbi decoding circuit with a plurality of test control signals to be synchronized with a test clock signal having a predetermined clock cycle.

2. The viterbi decoder as defined in claim 1, further comprising a first multiplexer for selecting the test clock signal applied from the test system in response to a control signal from the test means.

3. The viterbi decoder as defined in claim 1, wherein the viterbi decoding circuit includes:

a register for storing data applied from the test system; and a first address decoder for generating writing and reading control signals, wherein the register stores the data in response to the writing control signals, and the viterbi decoding circuit reads the data from the register in response to the reading control signals.

4. A viterbi decoder for performing viterbi decoding operations with a test system, the viterbi decoder comprising:

a clock for synchronizing the viterbi decoding operations;

a controller for generating decoding control signals synchronized to the clock;

a viterbi decoding circuit for performing the viterbi decoding operations in response to the decoding control signals, the viterbi decoding circuit including a symbol metric table unit, a branch metric unit, an add compare select unit, and a trace back unit;

a test register for storing test control signals applied from the test system and providing the test control signals to the viterbi decoding circuit, wherein the test control signals are synchronized with a test clock signal having a predetermined clock cycle; and an address decoder for generating enable signals to the controller and the test register, wherein the controller generates the decoding control signals in response to a first enable signal of the enable signals, and the test register stores the test control signals in response to a second enable signal of the enable signals.

5. The viterbi decoder as defined in claim 4, wherein the viterbi decoding circuit includes a second multiplexer for selecting either the test control signals from the test register or the decoding control signals from the controller.

6. The viterbi decoder as defined in claim 5, wherein the second multiplexer selects the test control signals from the test register in response to a test enable signal stored in and provided from the test register.

7. The viterbi decoder as defined in claim 4, further comprising a first multiplexer for providing the test clock signal to the controller and the viterbi decoding circuit in response to an enable signal from the test register.

8. The viterbi decoder as defined in claim 4, further comprising a first buffer for outputting the decoded data in the viterbi decoding circuit to the test system in response to a third enable signal of the enable signals from the second address decoder.

9. The viterbi decoder as defined in claim 4, further comprising a second buffer for outputting data received from the controller to the test system in response to a forth enable signal of the enable signals from the second address decoder.

10. A viterbi decoder for performing viterbi decoding operations with a test system, the viterbi decoder comprising:
- a viterbi decoding circuit for decoding code sequence and outputting decoded data to the test system in response to decoding control signals for the viterbi decoding operations and to test control signals for test operations;
- a normal register for storing the code sequence received from the test system;
- a first address decoder receiving control signals from the test system and generating writing and reading control signals, whereby the normal register stores the code sequence in response to the writing control signals, and the viterbi decoding circuit reads the code sequence from the normal register in response to the reading control signals;
- a second address decoder receiving the control signals from the test system and generating a plurality of enable signals;
- a test register for storing the test control signals from the test system in response to a first enable signal from the second address decoder;
- a first multiplexer for outputting one of a normal clock signal and a test clock signal from the test system in response to a control signal from the test register;
- a controller receiving the output selected in the first multiplexer and a frame synchronous signal from the test system and generating the decoding control signals in response to a second enable signal from the second address decoder; and
- a second multiplexer for selecting one of the decoding control signals from the controller and the test control signals from the test register in response to a control signal from the test register, whereby the second multiplexer providing the viterbi decoding circuit with the one selected wherein.

11. The viterbi decoder as defined in claim 10, further comprising:
- a first buffer for outputting the decoded data received from the viterbi decoding circuit to the test system in response to a third enable signal from the second address decoder; and
- a second buffer for outputting the data received from the controller to the test system in response to a forth enable signal from the second address decoder.

12. The viterbi decoder as defined in claim 10, wherein the control signals from the test system to the first and second address decoders includes address signals, a register writing strobe signal, a register reading strobe signal, test mode selecting signal, and normal mode selecting signal.

13. The viterbi decoder as defined in claim 10, wherein the decoding control signals are synchronized with the normal clock cycle of the frame synchronous signal, and the test control signals are synchronized with the test clock signal having a predetermined clock cycle.

* * * * *